United States Patent [19]

Bever

[11] Patent Number: 5,633,804
[45] Date of Patent: May 27, 1997

[54] METHOD FOR AUTOMATICALLY PRODUCING PRINTED WIRING BOARD FABRICATION DRAWINGS

[75] Inventor: Robert J. Bever, Chandler, Ariz.

[73] Assignee: Motorola, Inc., Schaumburg, Ill.

[21] Appl. No.: 359,113

[22] Filed: Dec. 19, 1994

[51] Int. Cl.$^6$ .................................................. G06F 17/50
[52] U.S. Cl. ........................... 364/489; 364/490; 364/491; 364/474.24
[58] Field of Search ................................. 364/488, 489, 364/490, 491, 468, 474.24; 395/141, 161

[56] References Cited

U.S. PATENT DOCUMENTS

| | | | |
|---|---|---|---|
| 4,580,228 | 4/1986 | Noto | 364/491 |
| 5,038,294 | 8/1991 | Arakawa et al. | 364/491 |
| 5,097,406 | 3/1992 | Narasimhan et al. | 364/491 |
| 5,097,422 | 3/1992 | Corbin et al. | 364/491 |
| 5,272,642 | 12/1993 | Suzuki | 364/474.24 |
| 5,337,404 | 8/1994 | Baudelaire et al. | 395/141 |
| 5,353,234 | 10/1994 | Takigami | 364/489 |
| 5,398,314 | 3/1995 | Saito et al. | 395/161 |
| 5,404,309 | 4/1995 | Yamamoto et al. | 364/488 |
| 5,444,844 | 8/1995 | Inoue et al. | 395/161 |
| 5,452,218 | 9/1995 | Tucker et al. | 364/468 |

OTHER PUBLICATIONS

An article entitled "Allegro: Correct–by–Design Solutions for PCB and MCM Design" by Cadence Design Systems, Inc., ©1993.

Barth et al., "Parameterized Schematics", 1988 ACM/IEEE Design Automation Conf, pp. 243–249.

Dewey et al., "Yoda: A Framework for the Conceptual Design VLSI Sys.", 1989 Int'l Conf, CAD–IEEE, pp. 380–383.

English et al., "Automated Engineering & Design Using Personal Computers", 1989 Conf. Petroleum & Chem. Indus.,—IEEE, pp. 69–74.

Rijmenants et al., "ILAC: An Automated Layout Tool for Analog CMOS Circuits", IEEE Jour of Solid–State Circuits, pp. 417–425, vol. 24, Iss. 2.

Renous et al., "Whistle: A Workbench for Test Development of Library–Based Designs", Computer Magazine, vol. 22, Iss. 4, pp. 27–41.

*Primary Examiner*—Kevin J. Teska
*Assistant Examiner*—Tyrone V. Walker
*Attorney, Agent, or Firm*—Frank J. Bogacz

[57] ABSTRACT

A method for producing printed wiring board (PWB) fabrication drawings obtains (20) design information for existing PWB fabrication requirements. If a new PWB design is needed PWB fabrication files are produced (18). Next project file information is obtained (24), if a drawing change is necessary. New project file information including drill hole information (30), custom notes (32) and placement and size of drawing symbols (34) are generated. This new project information is transferred (38) to a program for production of the PWB fabrication drawings.

28 Claims, 8 Drawing Sheets

5,633,804

METHOD FOR AUTOMATICALLY PRODUCING PRINTED WIRING BOARD FABRICATION DRAWINGS

BACKGROUND OF THE INVENTION AND SUMMARY OF THE INVENTION

The present invention pertains to printed wiring board fabrication drawings and more particularly to a method for automatically producing and editing printed wiring board fabrication drawings.

Computer automated design and computer automated engineering programs (CAD/CAE) exist for providing certain information relative to fabrication drawings for printed wiring boards (PWB). Previously printed wiring board fabrication drawings were made manually. This was a tedious process and one prone to errors. Modifications to these fabrication drawings required that the entire drawing be remade.

With the advent of computers CAD/CAE programs provided for automation of fabrication drawing production. One such program is the Allegro™ program produced by Cadence Design Systems Inc. Allegro is a trademark of Cadence Design Systems Inc. The Allegro program provides only a single drill table and drill figures at a time. The Allegro program allows only fixed notes to be affixed to the printed wiring board drawings. The Allegro program does not allow scaling of the board design within the fabrication drawing. The Allegro program does not allow for automatic update and merging of the fabrication drawing symbols. The Allegro program does not readily lend itself to fabrication drawing changes.

It is desirable to have an interface program to the Allegro program which overcomes the above mentioned shortcomings of the Allegro program and which directly interfaces with the Allegro program.

DESCRIPTION OF THE PREFERRED EMBODIMENT

Figure 1:
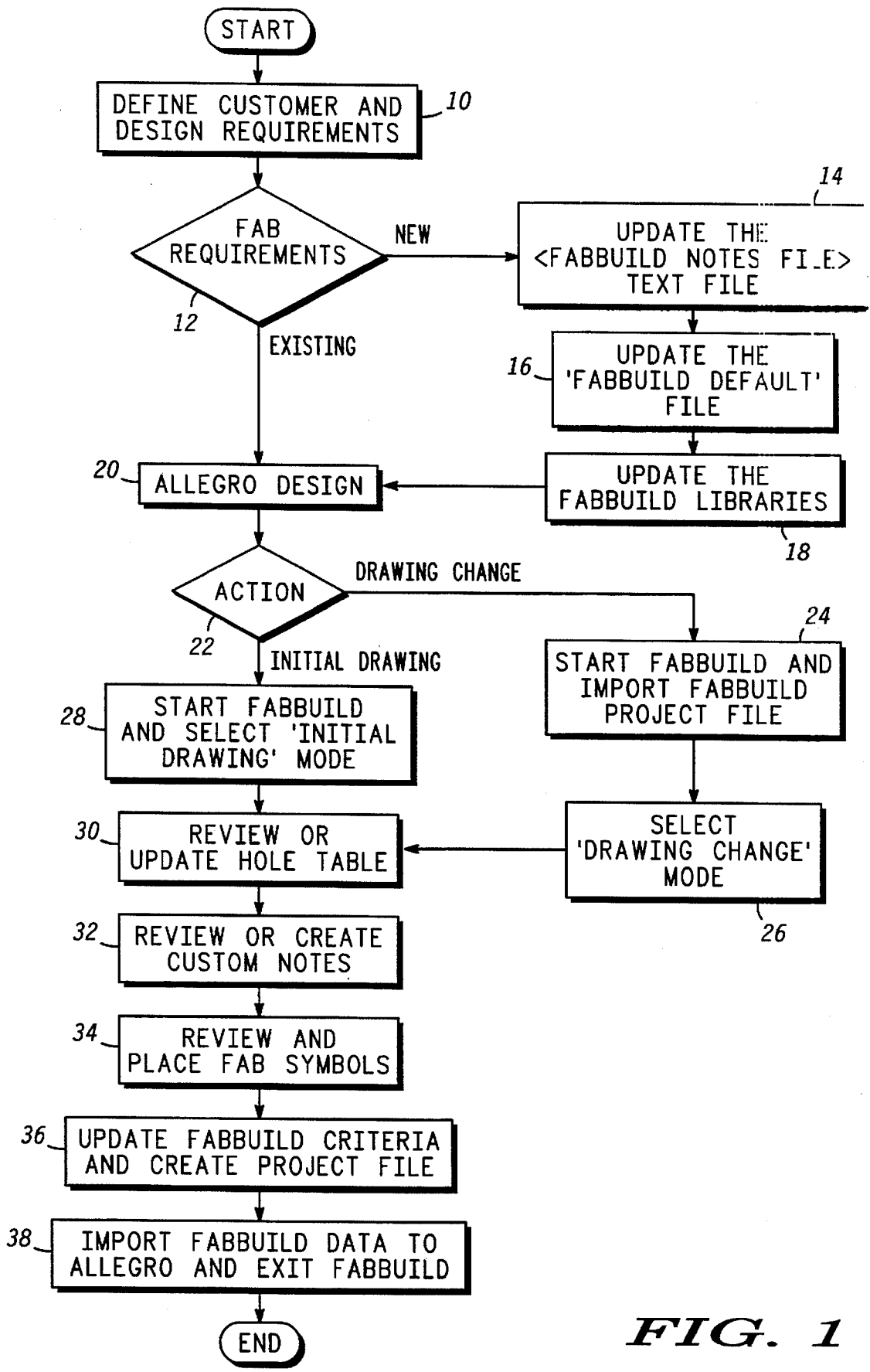
FIG. 1 is a flow chart of a method for creating fabrication drawings in accordance with the present invention.

FIG. 1 is a flow diagram of a method for creating fabrication drawings automatically using the program herein described called fabbuild. The fabbuild program preferably executes on an IBM RS6000 workstation running under AIX™ 3.2.5 MOTIF® 1.1 or compatible system. AIX is a trademark of the IBM Corporation. MOTIF is a registered trademark of the Open Software Foundation.

The TABLES 1 through 19 mentioned infra are depicted at the end of the specification in graphic form as tables for the convenience of the reader.

The fabbuild process in FIG. 1 begins at block 10 by defining the customer note and board design requirements. This process is done at the project level and is comprised of acquiring reference documents, customer contract agreements, and board design requirements. The data is compiled and it is determined whether the fabrication drawing requirements are new or existing (block 12). The customer refers to the end user of the printed wiring board (PWB) for which the fabrication drawings are prepared.

If the fabrication drawing requirements are new (block 12), then block 14 is called. Next, PWB fabrication files are produced. At block 14, the compiled customer and board design requirements are used to update or create a new fabbuild language file (TABLE 9, TABLE 10 and TABLE 11). The fabbuild language file is one element of the custom note generation process (FIGS. 2–4), which is used for any board configuration (e.g. through holes, blind holes, silkscreen, soldermask, etc.) and board type (e.g. multilayer, single sided, flex, multi-chip module (MCM), etc.). Block 16 is called after the fabbuild language file has been updated or created.

Figure 2:
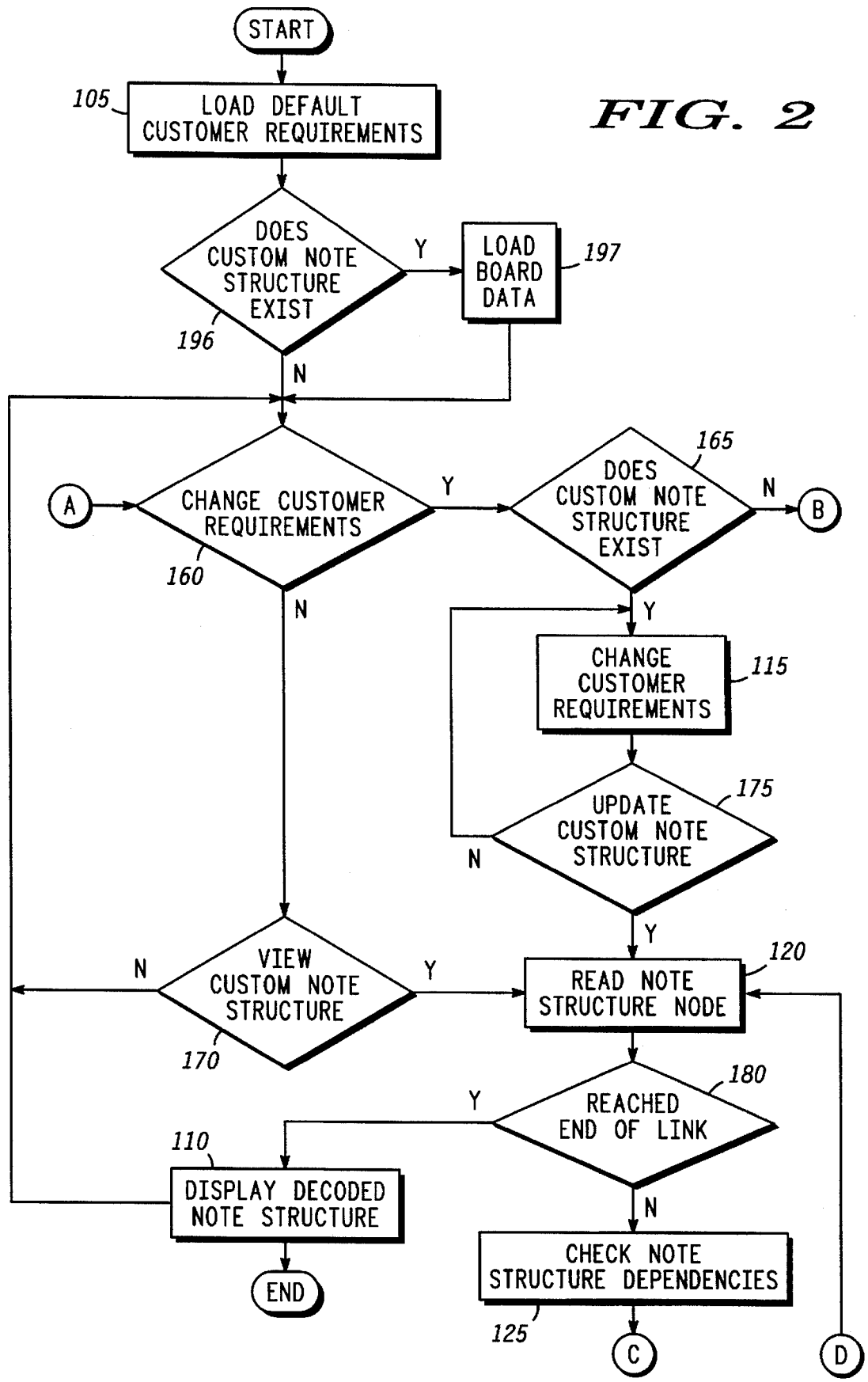
FIG. 2 is a flow chart of a method for creating custom fabrication notes in accordance with the present invention.
Figure 3:
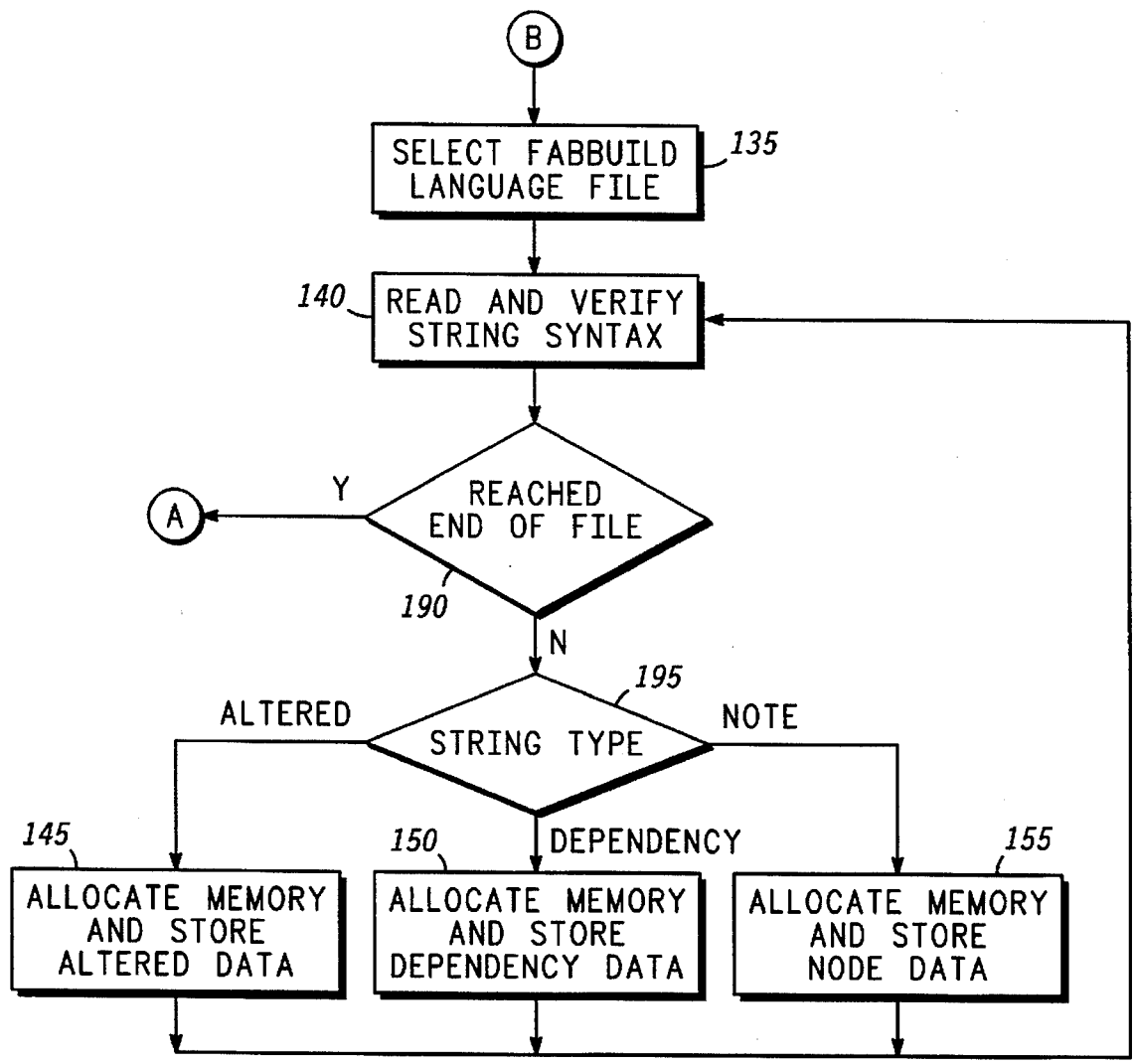
FIG. 3 is a continuation flow chart of a method for creating custom fabrication notes in accordance with the present invention.
Figure 4:
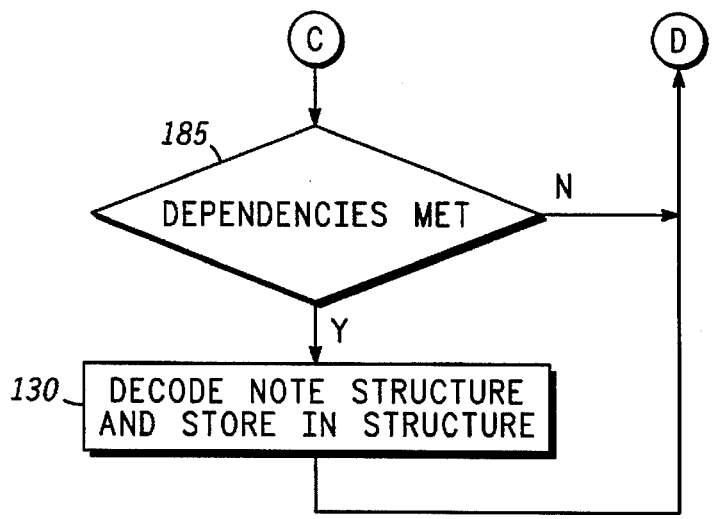
FIG. 4 is a continuation flow chart of a method for creating custom fabrication notes in accordance with the present invention.
Figure 6:
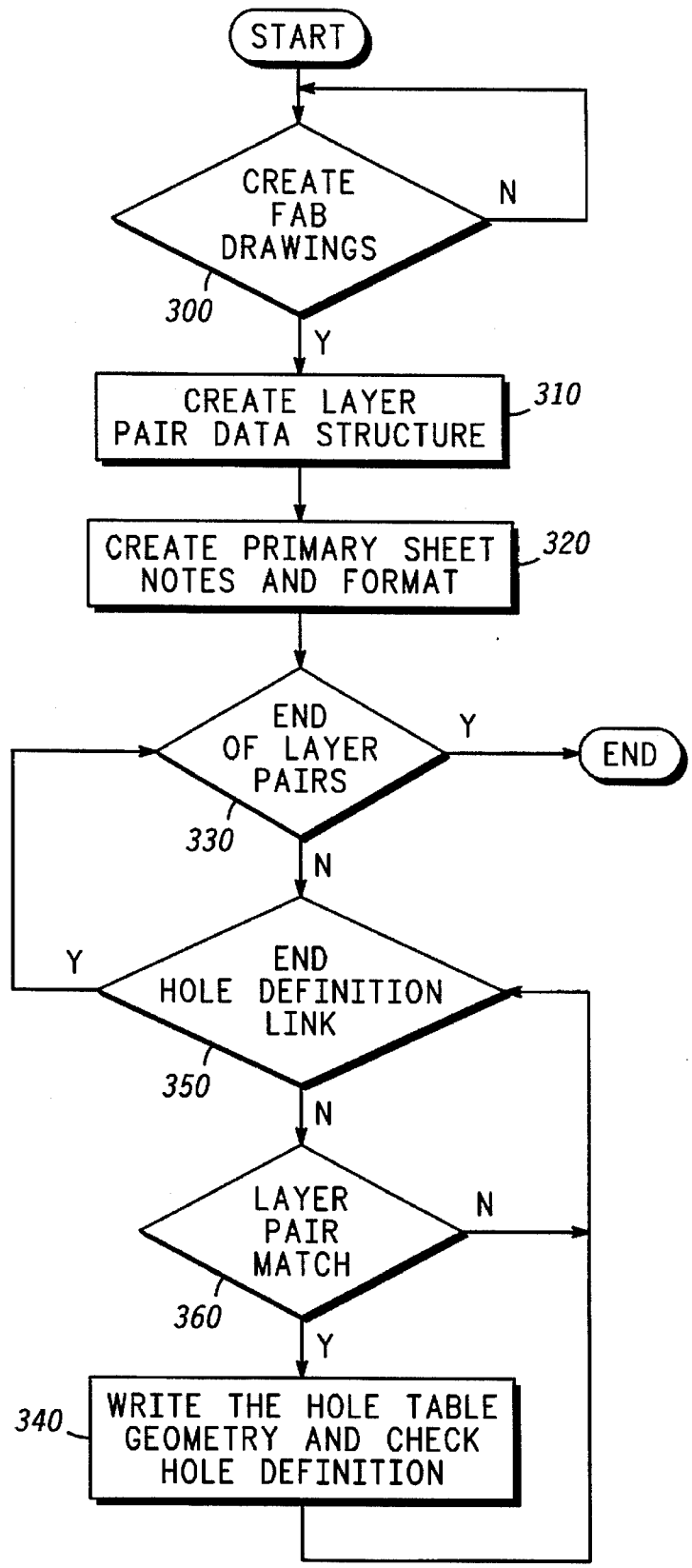
FIG. 6 is a flow chart of a method for creating multiple printed wiring board fabrication drawings in accordance with the present invention.

The default customer settings (e.g. design specifications, silkscreen color, hole drill figures, etc.), which are used in FIG. 2 (block 105), are updated in the fabbuild default file (block 16 and TABLE 12). The fabbuild default file provides a mechanism of setting the fabbuild menu data structures (TABLE 3) when the fabbuild program is initialized (block 28 or block 24). The data structure menu settings are one element in the process to create custom notes (FIGS. 2–4). The default settings can be changed after the fabbuild program is running (blocks 30 and 32). New customer Allegro plot symbols are created at block 18. The Allegro program is a PWB design software program which is used to create the electronic output to manufacture a PWB. All Allegro plot files are defined in Allegro Intermediate Plot File (IPF) format and represent graphical images of the PWB design. Allegro plot symbols are used by the fabbuild program to define specific customer fabrication drawing formats, board cross section details, drill symbols and other fabrication details. The plot files are placed during the fabbuild session (block 34) as graphic symbols and are merged together (FIG. 7) to create multiple fabrication drawing Allegro plot files (FIG. 6). The merged plot files are imported into the Allegro board design software after being merged (block 38). The Allegro plot files are stored in a plot file library that is read by fabbuild.

If the fabrication drawing requirements exist (block 12) in a fabbuild language file, then the board design is started (block 20) with the Cadence Design Systems Inc. Allegro software. Block 12 transfers control to block 20.

Next design information is obtained. Block 20 defines the process of creating the board design using the Cadence Design Systems Inc. Allegro software. Block 20 retrieves and creates the Allegro data base.

Next, it is determined whether a PWB fabrication drawing change is necessary. Project file (TABLE 19) information is obtained, if a drawing change is necessary. If the board design is completed and is the initial drawing (block 22), then block 28 is called. Block 28 starts the fabbuild process and reads the Allegro board design by extracting (TABLE 13) board data elements from the Allegro data base. The board elements extracted include board design holes, layer structure, line widths and spacing for each layer, and other board specific data.

If the board design is completed and requires a fabrication drawing change (block 22), then block 24 is called. Block 24 starts the fabbuild process and reads the previous fabbuild project file (TABLE 19). The fabbuild project file is the data base for one fabbuild session. The fabbuild project file contains all data elements, graphic elements and associated values that pertain to the previous run of the fabbuild process. Block 26 is called to read the Allegro board design by extracting (TABLE 13) board data elements from the Allegro data base. Changes to the holes are determined with the process method defined in FIG. 6.

Next, new project file information is generated. Block 30 provides a method of reviewing the total holes added, deleted or changed (drawing change only) during the import of the Allegro board design. The incremental changes are displayed at block 565 of FIG. 6. Changes to hole drill figures defined by the fabbuild default file (block 16) are done at this time.

Block 32 provides the method of creating custom notes for the fabrication drawing that match the board design requirements. This process is defined in FIGS. 2–4.

Block 34 provides a process of placing, moving and deleting the fabrication drawing Allegro plot files defined at block 18. The board design graphic outline is displayed and the outline can be moved or scaled (FIG. 7) within the fabrication drawing format graphic window.

Figure 7:
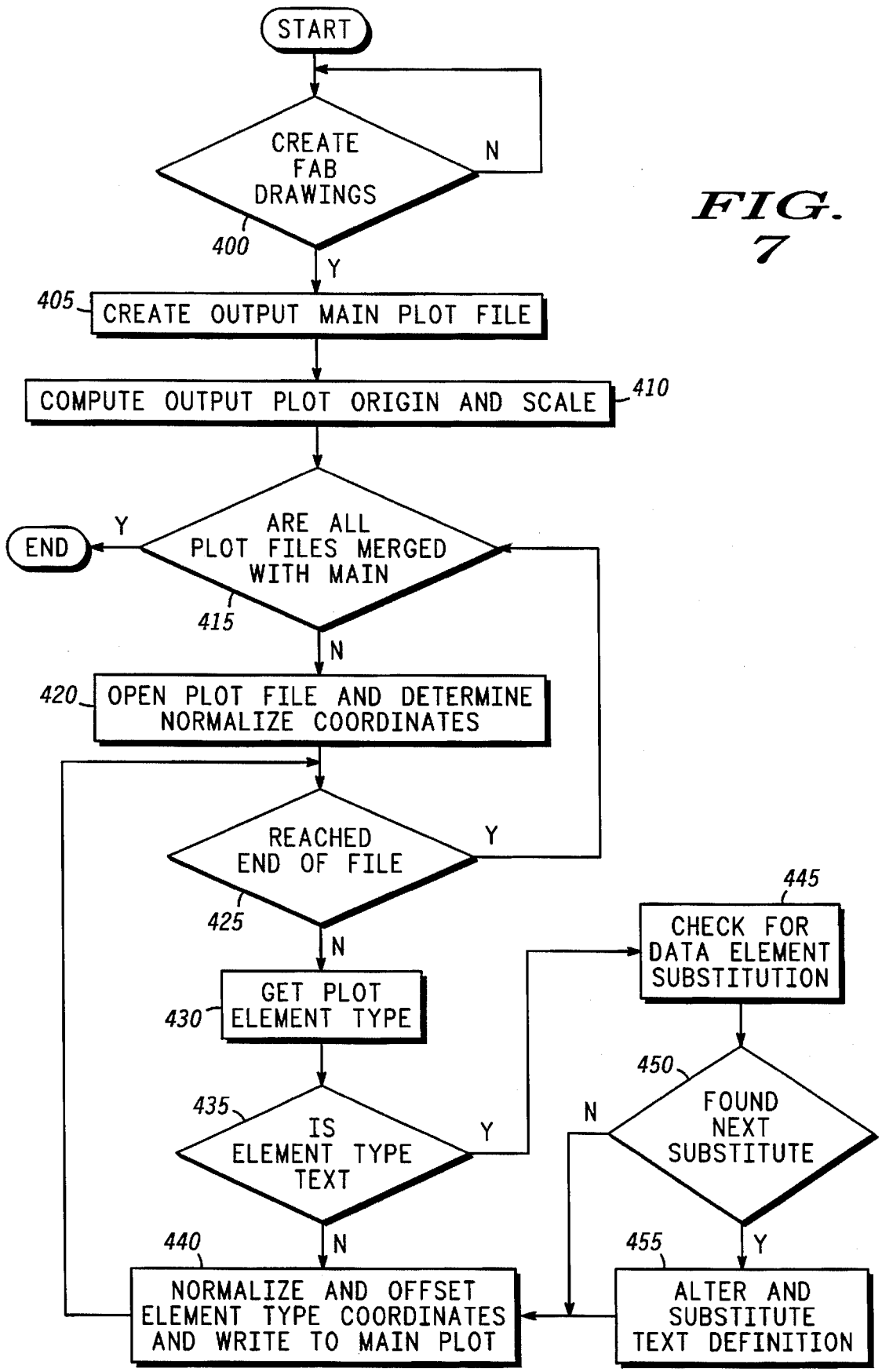
FIG. 7 is a flow chart of a method for merging plot files into a single plot file in accordance with the present invention.

Block 36 provides the process of updating design specific data elements that will be substituted into the plot files (FIG. 7, block 455) during the plot file merge process (FIG. 7).

Next, the new project file information is transferred for production of the PWB fabrication drawings by the Allegro program. Block 38 performs the process of merging the plot files (FIG. 7) placed at block 34, converting the custom notes (FIGS. 2–4) defined at block 32 to plot data, and converting the hole tables created at block 30 to plot data. The merged plot files, custom note plot data and hole plot data are merged into multiple output fabrication drawing plot files (FIG. 6) for transfer into the Cadence Design System Inc. Allegro software. The process is then terminated.

FIGS. 2–4 are a flow diagram of a method for creating custom fabrication notes based on customer requirements, fabbuild language file and board data. The process begins at block 105 with a request to load the default customer requirements. The customer requirements are extracted from the fabbuild default file as defined in TABLE 12 and the data from field 1710 is stored in TABLE 3 menu structures.

If board data must be loaded (block 196), then a request to load board data is sent to block 197. Block 197 responds by extracting layer, line width/space values, and other board values from one or more board extract files as defined in TABLE 13. The board values are stored in TABLE 3 menu structures.

If board data will not be loaded (block 196), then TABLE 3 board elements will not be updated.

If a change to customer default settings should not be made (block 160), then a request is made to view the existing note structure (block 170). If the existing note structure is not to be viewed (block 170), then the customer requirements can be changed (block 160).

If a request is made to change the customer requirements (block 160) and a request is made to load a fabbuild language file (block 165), then a fabbuild language file will be selected at block 135. Block 135 waits for a fabbuild language file selection and when received makes a request to read and verify the file syntax as defined by block 140. One string of the fabbuild language file is read at block 140 and the string type is parsed. The end of the fabbuild language file is checked at block 190 and if found makes a request to change the customer requirements (block 160). If the end of the fabbuild language file is not reached, then the string type is compared at block (195). If the string and string type is altered (TABLE 9) then a new value data structure is defined (TABLE 6) and the data are stored in fields 1105, 1110, and 1115 (block 145). If the string and string type is dependency (TABLE 10), then a new dependency structure is defined (TABLE 7) and the data are stored in fields 1205, 1210, 1215, and 1220 (block 150). If the string and string type is note (TABLE 11), then a new note structure is defined (TABLE 8) and the data are stored in fields 1305 and 1310 (block 155). After the data is stored, a new line is read from the fabbuild language file (block 140).

If a request is made to change the customer requirements (block 160) and the custom note structure exists (block 165), then the default customer requirements can be modified. A series of menus are presented and the customer values are changed in the menu data structures defined in TABLE 3.

If the custom note structure should not be updated (block 175) after making changes to customer requirements, then additional customer requirement changes can be made (block 115).

If the custom note structure should be updated (block 175) or displayed (block 110), then a request to decode and create the new custom note structure is made (block 175). Block 120 receives the request to create the new custom note structure and begins by reading one note structure node as defined in TABLE 5. A check is made to determine if the end of the note structure link is reached (block 180). If the end of the link has not been reached, then all of the note dependencies are checked (block 125) to determine if fields 1210 and 1215 match the requirements defined in the menu structure TABLE 3. If the dependency conditions are not met (block 185), then the note structure node is skipped and a new note structure node is read (block 120). If the dependency conditions are met in block 185, then block 130 is called to read each node of the sentence structure link (TABLE 8) and decode each encoded sentence (field 1305) and store in field 1310. In addition, the decoded sentence will be concatenated to the note buffer in field 805 for use in displaying the final note structure (block 110). The decoding process in block 130 parses each word or data element in field 1305. If the parsed element is a word, then the value is stored without alteration in field 1310. If the parsed element is a data element, then the value setting in the menu structure is found in TABLE 3. The menu element value is then compared to each value change node TABLE 6 (fields 1105 and 1110) and if found, field 1115 is stored in field 1310. If the menu element value is not found in the value change node (TABLE 6), then the menu element value is stored in field 1310. The process of parsing (block 130) continues until the end of the encoded string is reached.

If the end of note link is reached (block 180), then a request is made to display the note buffer (block 110). Block 110 will display the concatenated decoded note buffer (field 805) in the note list menu.

Figure 5:
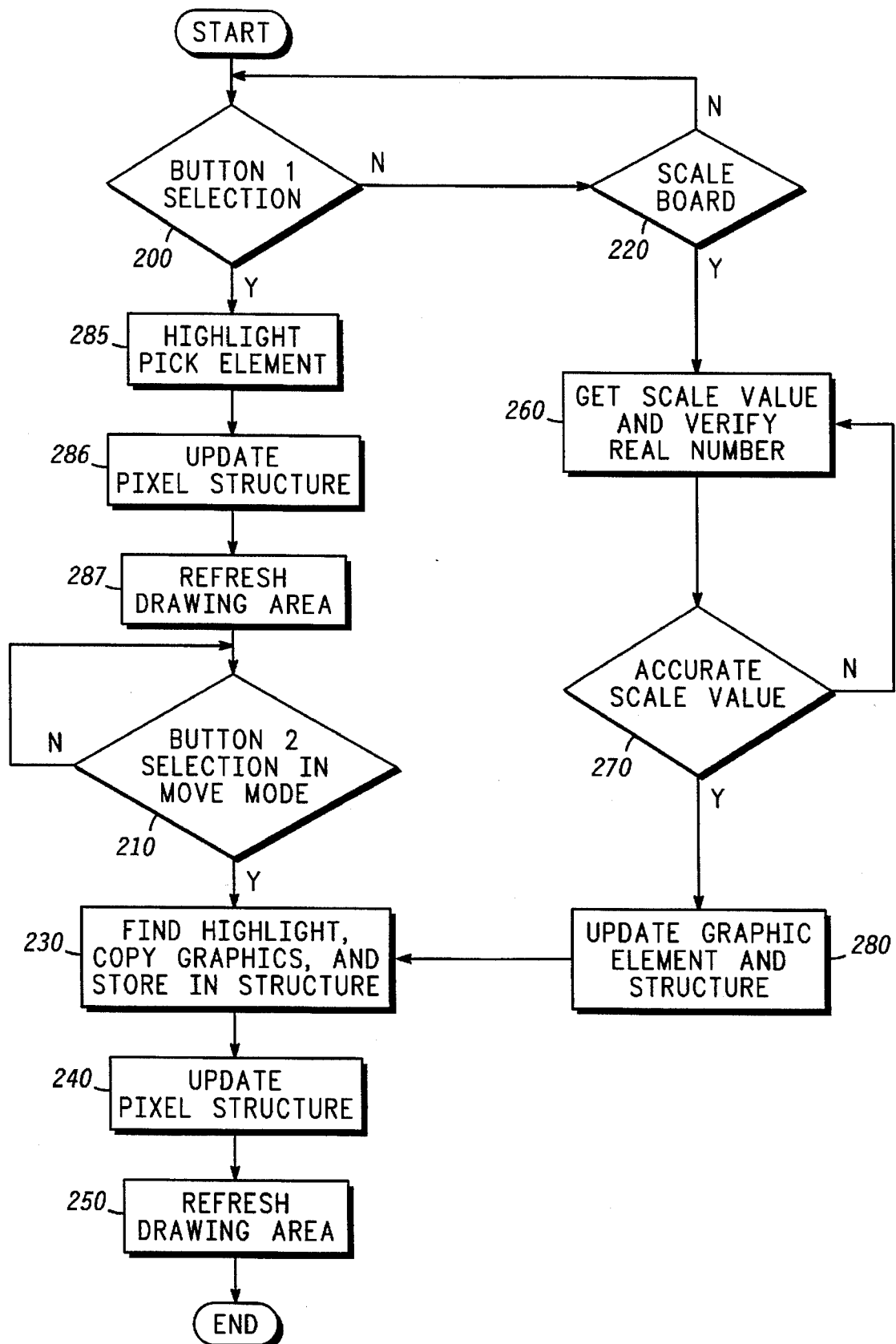
FIG. 5 is a flow chart of a method for moving and scaling a printed wiring board in accordance with the present invention.

FIG. 5 is a flow diagram of a method for moving and scaling the board within the fabrication drawing. If a request is made by selecting button one of the mouse (block 200), then a call to highlight the board element is passed to block 285. Block 285 will change the color of the board element to indicate a highlight by finding the board graphic element (TABLE 15, field 2010) node and changing color field 2005. Block 286 is called to update the expose and motion pixel data structure pointers (TABLE 14) with the color change. The new pixel color will be defined in field 2105 of the pixel data structure (TABLE 16). Block 287 will redraw the expose and motion pixel data structures (TABLE 16), which contain pointers in the sheet data structure (TABLE 14).

If a request to button one has been made, then the process will wait for a button two selection. If a request is made by selecting button two of the mouse (block 210), then a call to find the pick coordinates (block 230) will be made. The board graphic data structure (TABLE 15) will be updated with the new coordinates (fields 2020, 2025, 2040, and 2045) to reflect the new board position. Block 230 will change the color of the board element to indicate a non-highlighted element by finding the board graphic element (TABLE 15, field 2010) node and changing color field 2005. Block 240 is called to update the expose and motion pixel data structure pointers (TABLE 14) with the color change. The new pixel color will be defined in field 2105 of the pixel data structure (TABLE 16). Block 250 will redraw the expose and motion pixel data structures (TABLE 16), which contain pointers in the sheet data structure (TABLE 14).

If a button one selection is not made (block 200) and a request to scale the board to a different size has been made (block 220), then a call is made to get the scale value (block 260). Block 260 will get the scale real number and verify that the value is a real number. If the value entered is not a real number (block 270), then a call is made to get a new scale value (block 260). If the value entered is a real number (block 270), then a request is made (block 280) to update the board graphic data element coordinates (TABLE 15). Block 280 will find the board graphic data structure node (TABLE 15) from the graphic pointer (field 1905). The scale value is multiplied by the graphic coordinates (field 2020, 2025, 2030 and 2035) and the origin coordinates (fields 2040 and 2045) are adjusted by ½ of the scale expansion distance. Block 230 will change the color of the board element to indicate a non-highlighted element by finding the board graphic element (TABLE 15, field 2010) node and changing color field 2005. Block 240 is called to update the expose and motion pixel data structure pointers (TABLE 14) with the color change. The new pixel color is defined in field 2105 of the pixel data structure (TABLE 16). Block 250 will redraw the expose and motion pixel data structures (TABLE 16), which contain pointers in the sheet data structure (TABLE 14).

FIG. 6 is a flow diagram of a method for creating multiple fabrication drawings, which include custom notes, hole tables and drill figures for each board layer pair. The process begins by receiving a request (block 300) to create multiple fabrication drawings. Block 310 is called to create board layer pairs. All board layer pairs are determined by checking each hole definition data structure node (TABLE 17) and examining the start layer (field 2232) and end layer (field 2235). If the start layer and end layer do not match an existing layer data structure node (TABLE 1) start layer (field 605) and end layer (field 610) values, then a new layer data structure node (TABLE 1) will be added to the link.

Field 2232 will then be copied to field 605 and field 2235 will be copied to field 610. If a start layer (field 2232) and end layer (field 2235) match an existing layer data structure node, then the next hole definition data structure node (TABLE 17) will be checked. The process of looking at each hole definition data structure will continue until the end of the link is reached.

Block 320 is called to create the first sheet of the fabrication drawing. An output plot file is created by writing and merging multiple plot files to create the output plot file (FIG. 5). The custom note decoded strings defined in the FIGS. 2–4 data flow diagram are converted to plot file strings and written to the output file.

Block 330 checks for the end of the layer pair data structure link (TABLE 1). If the end of the layer pair link is reached, the process is terminated. If the end of the layer pair link has not been reached, then a request to block 350 is made.

Block 350 checks the hole definition data structure link, for an available node. If the end of the link is reached, then block 330 is called. If a new link is found, then block 360 is called.

Block 360 compares the hole definition data structure (TABLE 17) start layer (field 2232) and end layer (field 2235) to the layer pair data structure start layer (field 605) and end layer (field 610). If the layers do not match, then block 350 is called. If the layers do match, then block 340 is called.

Block 340 creates a new output plot file. Block 340 will write the hole table graphics to the output plot file along with the hole definition data structure (fields 2208, 2210, 2217, 2220, 2223, 2226, 2229, 2232 and 2235). All drill figures for the hole definition data structure (TABLE 17) will be converted to plot data and written to the plot file at coordinates defined in the X-Y data structure link (field 2238). When the drill figures are written to the plot file, block 350 is called to pull the next hole definition data structure node (TABLE 17).

FIG. 7 is a flow diagram of a method for merging Cadence Design Systems Inc. Allegro plot files into a single plot file. In addition, FIG. 7 shows a method of substituting plot file data elements with board specific data values. The process begins by receiving a request (block 400) to create multiple fabrication drawings.

Block 405 is called to open the main fabrication sheet plot file that all output plot data will be written.

Block 410 is called to compute the output plot origin and scale. The board graphic node (field 2010) is found in the graphic data structure (TABLE 15). The X and Y origin coordinates are determined from fields 2040 and 2045. The origin distance coordinates are divided by the drawing scale to determine the starting output board plot file coordinates.

Block 415 checks for plot files that must be written to the main plot file. The plot files that must be written are determined by examining the graphic data structure (TABLE 15) for plot files (fields 2010 and 2015) that were placed in the fabbuild graphics editor or hole table drill figures that are derived from the hole definition data structure (TABLE 17, field 2208). If no plot files are available, then the process is terminated. If plot files remain that have not been merged, then block 420 is called.

Block 420 searches the symbol data structure (TABLE 18) and matches the symname (field 2305) with the graphic name (field 2015) or hole character name (field 2208). The symname (field 2305) plot file is opened and the normalizing plot file coordinates (fields 2335 and 2340) are retrieved for use in block 440.

Block 425 determines if the end of the symname (field 2305) plot file has been reached. If the end of the plot file is reached, then block 415 is called. If the end of the plot file has not been reached, then block 430 is called.

Block 430 reads a string from the plot file and identifies the plot file element type as a line, arc, text, polygon, filled rectangle or figures. Block 435 is called to process the parsed plot string.

If the plot element type is not text, then block 435 calls block 440. Block 440 writes the element type to the main plot file opened in block 405. The element type written to the main plot file remains the same and the coordinates are defined by subtracting the normalizing coordinates defined in block 420. Plot files defined in the graphic data structure (TABLE 15), also subtract the graphic origin coordinate (fields 2040 or 2045) from the plot coordinates. Drill character plot coordinates defined in the hole definition structure (TABLE 17), also subtract the board origin coordinates computed in block 410.

If the plot element type is text (block 435), then block 445 is called. Block 445 parses the plot text string and determines if the text string is a data element key word (TABLE 12, field 1705). If the text is not a data element key word (block 450), then block 440 is called to write the existing text plot string to the main plot file defined in block 405. If the text is a data element key word (block 450), then block 455 is called.

Block 455 examines the menu data structure settings (TABLE 3) and finds the data element key word value. The data element key word value is substituted for the original plot text string and block 440 is called to write the substituted text string to the main plot file defined in block 405.

Figure 8:
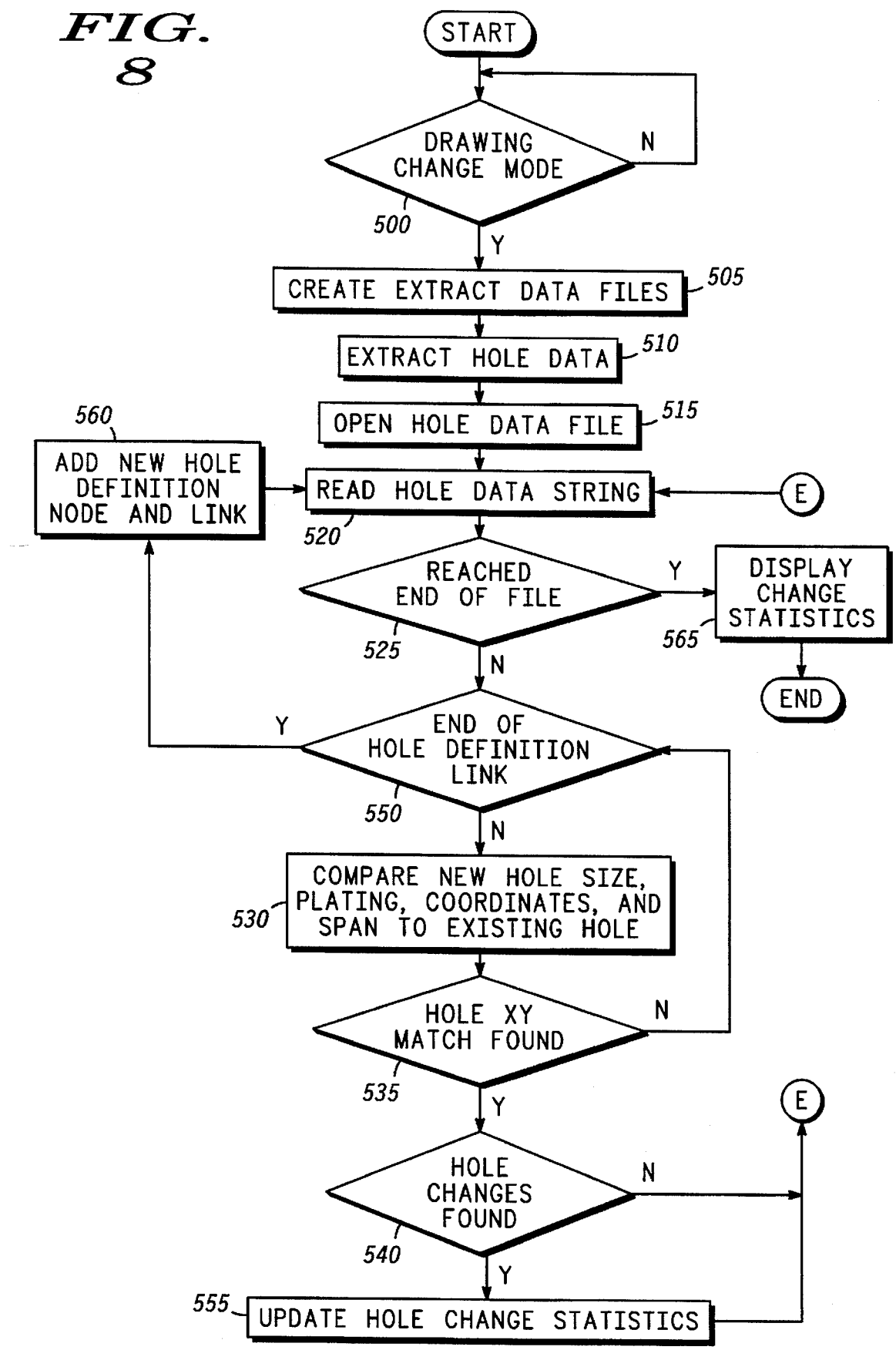
FIG. 8 is a flow chart of a method for determining printed wiring board hole changes in accordance with the present invention.

FIG. 8 is a flow diagram of a method for determining incremental hole changes. A hole change is considered a change to hole plating, size, layer span or coordinate position. The process begins by receiving a request (block 500) to perform a drawing change. Block 505 is called to create the Cadence Design Systems Inc. Allegro hole extract file (TABLE 13). The hole extract file provides the mechanism to extract hole data from the Cadence Design Systems Inc. Allegro board file.

Block 510 is called to perform the process of extracting the hole data from the Cadence Design Systems Inc. Allegro board file. The hole data is stored in a temporary file that is opened in block 515. Block 515 sets the file pointer at the third line in the file to begin the file read process.

Block 520 reads one line of the hole data extract file and parses the hole extract string to define the hole plating, size, layer span and coordinate position. If the end of the file is reached (block 525), then block 565 is called. If the end of the file is not reached (block 525), then the end of the hole definition data structure (TABLE 17) is checked (block 550). If the end of the hole definition data structure is not reached (block 550), then block 530 is called.

Block 530 will read one hole definition data structure (TABLE 17) and compare the extracted hole size (block 520) to field 2217. If the hole sizes match, then the extracted X-Y coordinate position (block 520) is compared to each X-Y data structure node (TABLE 2, fields 705 and 710) for a coordinate position match. If a hole match is not found (block 535), then the end of the hole definition link is checked (block 550) and the compare process at block 530 continues. If a hole match is found (block 535), then the hole layer span (fields 2232 and 2235) and hole plating (field 2229) are compared to the extracted hole layer span and plating (block 520). In addition, the coordinate position defined by fields 705 and 710 are flagged as non-deleted (field 715). If the hole layer span and/or plating are changed (block 540), the X-Y data structure field 715 is flagged to a change status at block 555 and the next string is read from the extract file (block 520). If the hole layer span and/or plating are not changed (block 540), then the next string is read from the extract file (block 520).

If the end of the hole definition link is reached (block 550), then block 560 is called. Block 560 defines a new hole definition data structure (TABLE 17) and copies the extracted data defined in block 520 to the new node. The new node is linked with the main hole definition link. In addition, the X-Y data structure status (field 715) for the new hole is flagged as added.

If the end of the extract file is reached (block 525), then block 565 is called. Block 565 read each X-Y coordinate data structure node (TABLE 2, field 715) and determines the holes that were added, require deleting, or have been changed. All holes requiring deleting are removed from the X-Y data structure links and a final count of added, deleted and change holes are compiled and displayed. The process is then terminated.

TABLE 1 start_layer (605)
end_layer (610)

TABLE 1 illustrates the printed wiring board layer data structure.

Field 605 is an integer to a single start layer.
Field 610 is an integer to a single end layer.

TABLE 2

X (705)
Y (710)
status (715)

TABLE 2 illustrates the X-Y data structure, which is pointed to by the hole definition data structure (TABLE 17, field 2238).

Field 705 is an integer defining the X hole coordinate.
Field 710 is an integer defining the Y hole coordinate.
Field 715 is an integer defining the incremental status of the hole.

TABLE 3 pw_0 (805)
pw_1_1_1 (810)
pw_1_1_1_a (815)
pw_1_1_2 (820)
pw_1_1_3 (825)
pw_1_2_1_and_pw_1_2_2 (830)
pw_1_2_3_and_pw_1_2_4 (835)
pw_1_3_1_thru_pw_1_7_2 (840)
pw_1_8_1_thru_pw_1_14_3 (845)
pw_0_final (850)

TABLE 3 illustrates the customer requirements menu data structure. Each field (805, 810, 815, 820, 825, 825, 830, 835, 840, 845, and 850) contains an address pointer to a unique menu data structure.

Field 805 defines a pointer to data structure that stores a pointer to the custom note data structure (TABLE 4) and character pointers to the decoded custom note strings.

Field 810 defines a pointer to a menu structure that stores the customer fabrication drawing and dimension specification names, board type and make.

Field 815 defines a pointer to a menu structure that stores the customer primary, secondary and design specification names, and board via type.

Field 820 defines a pointer to a menu structure that stores the customer flex fabrication specification name, and flex type and make.

Field 825 defines a pointer to a menu structure that stores the customer flex design requirements for class and inspection criteria.

Field 830 defines a pointer to a menu structure that stores the board base thickness, material type, and copper type.

Field 835 defines a pointer to a menu structure that stores the board material and adhesive type.

Field 840 defines a pointer to a menu structure that stores the customer required edge plating, board line width/space, hole annular ring, etchback type, solder mask requirements, conformal coating, film type, and producibility.

Field 845 defines a pointer to a menu structure that stores the customer requirements for silkscreen, soldermask, marking, bow and twist, rated voltage, packaging, preservation, via hole fill and annular ring.

TABLE 4 value (905)
note (910)
altered_note (915)

TABLE 4 illustrates the custom note data structure.

Field 905 defines an address pointer to the value change data structure (TABLE 6).

Field 910 defines an address pointer to the note data structure (TABLE 5).

Field 915 defines an integer flag that states if the user has changed the decoded custom specified in Field 805 (TABLE 3).

TABLE 5 depend (1005)
sentence (1010)

TABLE 5 illustrates the note data structure.

Field 1005 defines an address pointer to the depend data structure (TABLE 7).

Field 1010 defines an address pointer to the sentence data structure (TABLE 8).

TABLE 6 attribute (1105)
value_name (1110)
new_alpha_name (1115)

TABLE 6 illustrates the value change data structure.

Field 1105 defines the data element attribute that is loaded from the fabbuild language file (block 135) when a value change string is detected.

Field 1110 defines the attribute value that is associated with the attribute name. The field 1110 value will be substituted for the field 1115 value during the decode process of the note sentence (block 130), if the attribute is found in the note sentence.

TABLE 7 attribute (1205)
value1 (1210)
value2 (1215)
value_type (1220)

TABLE 7 illustrates the dependency data structure.

Field 1205 defines the data element attribute and associated values (field 1210 and 1215) that are loaded from the fabbuild language file (block 135) when a dependency string is detected.

During the decode of the note sentences (block 125), the dependency values are compared to the value type (field 1220) and if the same, then the dependency has been met and the sentence will be used.

TABLE 8 sentence (1305)
decoded_sentence (1310)

TABLE 8 illustrates the sentence data structure.

Field 1305 defines the encoded note string that is loaded from the fabbuild language file (block 135) when a encoded string is detected.

Field 1310 defines the decoded sentence that is created during block 130 processing.

TABLE 9

|string_type (1405)|value_attribute (1410)|value1 (1415)
|value2 (1420)|

TABLE 9 illustrates each field of the value string defined in the fabbuild language file.

Field 1405 defines the string as a value change string. The first character of the string must begin with a '<' character and the last character must be '>' to denote a data element definition.

Field 1410 defines the data element type that is store in field 1105. The variable length values (fields 1415 and 1420) are stored in fields 1110 and 1115.

TABLE 10

|string_type (1505)|depend_attribute (1510)|op (1515)|
value1 (1520)|value2 (1525)|

TABLE 10 illustrates each field of the dependency string defined in the fabbuild language file.

Field 1505 defines the string as a dependency string.

Field 1510 defines the dependency attribute that is stored in field 1205. The first character of the string must begin with a '<' character and the last character must be '>' to denote a data element definition.

Field 1515 defines the first value of the dependency definition that is stored in field 1210.

Field 1520 defines the operator that is used for the comparison between fields 1515 and 1525. Field 1520 is stored in field 1220.

Field 1525 defines the second value of the dependency definition that is stored in field 1215.

TABLE 11

| |
|---|
| \|element (1605)\| |

TABLE 11 illustrating the one field of the encoded note string in the fabbuild language file.

Field 1605 is one field and is defined as a variable word or a data element definition. If the word is defined as a data element definition, then the first character of the string must begin with a '<' character and the last character must be '>' to denote a data element definition. One or more 1605 fields can be defined in a single string in the fabbuild language file. Field 1605 is stored in field 1305.

TABLE 12

| |
|---|
| \|data_element (1705)\|value (1710)\| |

TABLE 12 illustrates a single data element definition in the fabbuild default file for customer requirements.

Field 1705 defines the data element type that corresponds to a menu data structure node in TABLE 3. The first character of the string must begin with a '<' character and the last character must be '>' to denote a data element definition.

Field 1710 defines 1 or more variable data element values based on the data element type that will be stored in the menu data structure node in TABLE 3.

TABLE 13

| |
|---|
| \|data1 (1805)\|op (1810)\|data2 (1820)\| |

TABLE 13 illustrates two data fields separated by an operator character in the data extract files from the board file.

Fields 1805 and 1815 are separated by an operator (field 1810). One or more data fields can be defined in an extract file and each data field will have variable data strings defining board attributes. Field 1805 must begin with a '<' character and the last character must be '>' to denote a data element definition.

TABLE 14

| |
|---|
| graphic (1905) |
| sheetname (1910) |
| Xtent (1915) |
| Ytent (1920) |
| sheet_offset_X (1925) |
| sheet_offset_Y (1930) |
| Xpixel (1935) |
| Ypixel (1940) |
| expose (1945) |
| motion (1950) |
| motionprev (1955) |

TABLE 14 illustrates the sheet data structure.

Field 1910 is an address pointer to the graphic data structure (TABLE 15).

Field 1915 is a pointer to the string that defines the sheet name.

Field 1920 is an integer that defines the X dimension of the fabrication drawing sheet area.

Field 1920 is an integer that defines the Y dimension of the fabrication drawing area.

Field 1925 is an integer that defines the X offset dimension from the graphic window origin.

Field 1930 is an integer that defines the Y offset dimension from the graphic window origin.

Field 1935 is an integer that defines the X pixel dimension of the fabrication drawing area.

Field 1940 is an integer that defines the Y pixel dimension of the fabrication drawing area.

Field 1945 is an address pointer the pixel data structure (TABLE 16).

Field 1950 is an address pointer the pixel data structure (TABLE 16).

Field 1955 is an address pointer the pixel data structure (TABLE 16).

TABLE 15

| |
|---|
| color (2005) |
| graphic_type (2010) |
| graphic_name (2015) |
| X (2020) |
| Y (2025) |
| offset_X (2030) |
| offset_Y (2035) |
| origin_dis_X (2040) |
| origin_dis_Y (2045) |
| active_node (2050) |

TABLE 15 illustrates the graphic data structure.

Field 2005 is an integer that defines the color of the graphic element.

Field 2010 is an integer that defines the type of graphic element.

Field 2015 is a pointer to a string that defines the name of the graphic element.

Field 2020 is an integer that defines the X location of the graphic element.

Field 2025 is an integer that defines the Y location of the graphic element.

Field 2030 is an integer that defines the X distance from the graphic origin to the lower left corner of the graphic element.

Field 2035 is an integer that defines the Y distance from the graphic origin to the lower left corner of the graphic element.

Field 2040 is an integer that defines the X distance from the graphic origin to the window origin.

Field 2045 is an integer that defines the Y distance from the graphic origin to the window origin.

Field 2050 is an integer that flags if the graphic element has been selected.

TABLE 16

| |
|---|
| color (2105) |
| X1 (2110) |
| Y1 (2115) |
| X2 (2120) |
| Y2 (2125) |

TABLE 16 illustrates the pixel data structure.

Field 2105 is an integer that defines the color of the graphic element.

Field 2110 is an integer that defines the X1 dimension of the pixel line.

Field 2115 is an integer that defines the Y1 dimension of the pixel line.

Field 2120 is an integer that defines the X2 dimension of the pixel line.

Field 2125 is an integer that defines the Y2 dimension of the pixel line.

TABLE 17 row_pos (2201)
geometric_selection_col (2203)
geometric_selection_widget (2204)
geometric_value (2205)
geometric_value_col (2206)
geometric_value_widget (2207)
hole_char (2208)
combine_hole_type (2209)
hole_type (2210)
hole_char_col (2211)
hole_char_widget (2212)
combine_hole_type_col (2213)
combine_hole_type_widget (2214)
hole_type_col (2215)
hole_type_widget (2216)
hole_size (2217)
hole_size_col (2218)
hole_size_widget (2219)
count (2220)
count_col (2221)
count_widget (2222)
min_tol (2223)
min_tol_col (2224)
min_tol_widget (2225)
max_tol (2226)
max_tol_col (2227)
max_tol_widget (2228)
plating_type (2229)
plating_type_col (2230)
plating_type_widget (2231)
start_layer (2232)
start_layer_col (2233)
start_layer_widget (2234)
end_layer (2235)
end_layer_col (2236)
end_layer_widget (2237)
XY (2238)

TABLE 17 illustrates the hole definition data structure.

Field 2201 is an integer defining the hole table row position.

Field 2203 is an integer defining the geometric selection position.

Field 2204 is a pointer to the geometric widget.

Field 2205 is an integer value for the geometric value.

Field 2206 is a integer defining the geometric value position.

Field 2207 is a pointer to the geometric value widget.

Field 2208 is the string pointer to the hole character definition.

Field 2209 is an integer flag for the hole combine type.

Field 2210 is an integer the hole type.

Field 2211 is an integer for the hole char position.

Field 2212 is a pointer to the hole character widget.

Field 2213 is an integer defining the combine hole type position.

Field 2214 is a pointer to the combine hole type widget.

Field 2215 is an integer to the hole type position.

Field 2216 is a pointer to the hole type widget.

Field 2217 is an integer for the hole size.

Field 2218 is an integer to the hole size position.

Field 2219 is a pointer to the hole size widget.

Field 2220 is an integer for the hole count.

Field 2221 is an integer for the hole count position.

Field 2222 is a pointer to the hole count widget.

Field 2223 is an integer for the min hole tolerance.

Field 2224 is an integer for the minimum tolerance position.

Field 2225 is a pointer to the minimum tolerance widget.

Field 2226 is an integer for the maximum hole tolerance.

Field 2227 is an integer for the maximum tolerance position.

Field 2228 is a pointer to the maximum tolerance widget.

Field 2229 is an integer for the plating type.

Field 2230 is an integer for the plating type position.

Field 2231 is a pointer to the plating type widget.

Field 2232 is an integer for the start layer.

Field 2233 is an integer for the start layer position.

Field 2234 is a pointer to the start layer widget.

Field 2235 is an integer for the end layer.

Field 2236 is an integer for the end layer position.

Field 2237 is a pointer to the end layer widget.

Field 2238 is a pointer to the X-Y data structure.

TABLE 18 symname (2305)
symtype (2310)
height (2315)
weight (2320)
Xoffset (2325)
Yoffset (2330)
norx (2335)
norY (2340)

TABLE 18 illustrates the symbol data structure.

Field 2305 is a pointer to a string that defines the plot symbol name.

Field 2310 is an integer that defines the type of plot symbol or file.

Field 2315 is an integer that defines the Y dimension of the symbol.

Field 2320 is an integer that defines the X dimension of the symbol.

Field 2325 is an integer that defines the X dimension from the symbol origin to the lower left corner of the plot file extent.

Field 2330 is an integer that defines the Y dimension from the symbol origin to the lower left corner of the plot file extent.

Field 2335 is an integer that defines the X dimension of the plot file after the plot coordinates have been normalized.

Field 2340 is an integer that defines the Y dimension of the plot file after the plot coordinates have been normalized.

TABLE 19

|data_element (2405)|value (2410)|

TABLE 19 illustrates a single data element definition in the fabbuild project file. The fabbuild project file is a data base for the fabbuild process and contains all the fabbuild session board elements and menu settings.

Field 2405 defines the data element type that corresponds to menu settings (TABLE 3), hole definitions (TABLE 17) and other design requirements. The first character of the string must begin with a '<' character and the last character must be '>' to denote a data element definition.

Field 2410 defines one or more variable data element values based on the data element type that will be stored in a fabbuild data structure.

Figure 9:
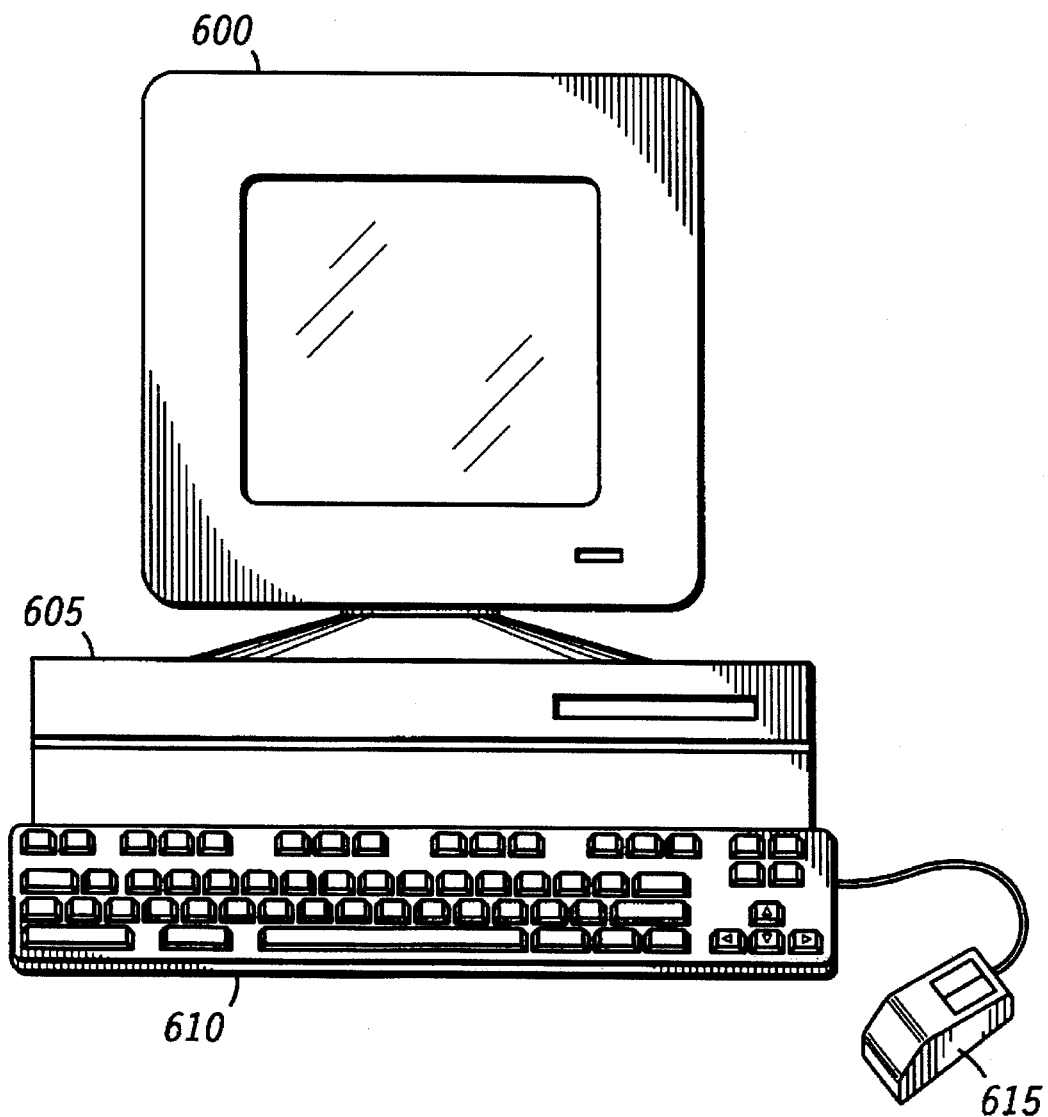
FIG. 9 is a block diagram of a computer system for executing the method of automatically producing PWB fabrication drawings in accordance with the present invention.

FIG. 9 is a block diagram of a computer system for executing the method of automatically producing PWB fabrication drawings. The fabbuild program executes on an IBM RS6000 workstation Such a workstation is depicted in FIG. 9. Other equivalent workstations are suitable for implementation of the present invention. FIG. 9 shows a workstation including display screen 600, computer 605, keyboard 610 and a two button mouse 615. This workstation configuration allows a user to execute the fabbuild program as well as the Allegro program.

The interfacing of the fabbuild program to the Allegro program provides various benefit and advantages. Among these benefits and advantages use of the fabbuild program can typically provide an overall reduction in fabrication cycle time from 1–3 days to 1–2 hours. Further fabbuild creates custom notes for each PWB design. The fabbuild program eliminates errors resulting from manual changes to fabrication drawings. The fabbuild program automatically maintains tables for hole count, hole size, tolerances, etc. for any PWB changes. The fabbuild program also provides for merging multiple Allergro plot files into a single Allegro plot file. All of the above advantages lead to accurate cost estimation and production of PWB in a timely fashion, thereby lowering the cost of PWBs.

Although the preferred embodiment of the invention has been illustrated, and that form described in detail, it will be readily apparent to those skilled in the art that various modifications may be made without departing from the spirit of the invention or from the scope of the appended claims.

What is claimed is:

1. A method for producing PWB fabrication drawings comprising the steps of:
   determining whether a PWB fabrication requirements, requested by a user, are new or existing;
   obtaining design information for the PWB fabrication requirements, if the PWB fabrication requirements are existing;
   producing PWB fabrication files, if the PWB fabrication requirements are new;
   determining whether a PWB fabrication drawing changes is necessary;
   obtaining project file information, if a drawing change is necessary;
   generating new project file information;
   updating a drill hole table with changes made to a drill hole of a PWB by the user;
   extracting hole data from the drill hole table;
   reading parameters of a drill hole from input from the user;
   comparing the parameters of the drill hole with the hole data from the drill hole table; and
   transferring the new project file information including the updated drill hole table for production of the PWB fabrication drawings.

2. A method for producing PWB fabrication drawings as claimed in claim 1, wherein the step of producing PWB fabrication files includes the step of updating a text file for PWB fabrication drawing notes.

3. A method for producing PWB fabrication drawings as claimed in claim 1, wherein the step of producing PWB fabrication files further includes the step of updating a default file.

4. A method for producing PWB fabrication drawings as claimed in claim 1, wherein the step of producing PWB fabrication files further includes the step of updating a library file.

5. A method for producing PWB fabrication drawings as claimed in claim 1, wherein the step of obtaining design information includes the step of retrieving program files from an Allegro program.

6. A method for producing PWB fabrication drawings as claimed in claim 1, wherein the step of obtaining project file information includes the step of reading a data base of graphic and data elements of a previous execution of the method for producing PWB fabrication drawings.

7. A method for producing PWB fabrication drawings as claimed in claim 6, wherein the step of obtaining project file information further includes the step of extracting PWB data elements from an Allegro program.

8. A method for producing PWB fabrication drawings as claimed in claim 1, wherein the step of updating includes the step of updating the drill hole table of an Allegro program.

9. A method for producing PWB fabrication drawings as claimed in claim 8, wherein the step of extracting hole data includes the step of
   extracting the hole data from the drill hole table of the Allegro program.

10. A method for producing PWB fabrication drawings as claimed in claim 9, wherein the step of comparing the parameters includes the steps of:
    updating the drill hole table with the input of the user, if a drill hole size from the input of the user and a drill hole size of the drill hole table miscompare;
    updating the drill hole table with the input of the user, if a hole layer span from the input of the user and a hole layer span of the drill hole table miscompare;
    updating the drill hole table with the input of the user, if a plating indication from the input of the user and a plating indication of the drill hole table miscompare; and
    displaying the updated drill hole table.

11. A method for producing PWB fabrication drawings as claimed in claim 10, wherein the step of updating the drill hole table includes the step of iterating the steps of: extracting; reading; comparing; updating, if a hole size; updating, if a hole layer span; updating, if a plating indication; and displaying for a plurality of holes of said PWB fabrication drawing.

12. A method for producing PWB fabrication drawings as claimed in claim 11, wherein the step of generating further includes the step of creating a custom note table with changes made by the user.

13. A method for producing PWB fabrication drawings as claimed in claim 12, wherein the step of creating a custom note table includes the steps of:
    extracting PWB board data, if changes to the PWB board data are requested by the user;
    obtaining custom notes supplied by the user; and
    updating the custom note table with the custom notes supplied by the user.

14. A method for producing PWB fabrication drawings as claimed in claim 13, wherein the step of creating a custom note table further includes the step of iterating the steps of: extracting, obtaining custom notes and updating the custom note table for each of a plurality of PWBs.

15. A method for producing PWB fabrication drawings as claimed in claim 14, wherein the step of creating a custom note table includes the step of displaying to the user the updated custom note table.

16. A method for producing PWB fabrication drawings as claimed in claim 15, wherein the step of creating a custom note table includes the steps of:

reading a string of syntax from an input supplier by the user;

parsing a string type from the string of syntax;

storing custom note data, if a custom note is parsed;

storing dependency data, if dependency data is parsed; and storing altered data, if altered data is parsed.

17. A method for producing PWB fabrication drawings as claimed in claim 16, wherein the step of creating a custom note table further includes the step of iterating the steps of: reading, parsing, storing custom note data, storing dependency data and storing altered data for each of a plurality of PWBs.

18. A method for producing PWB fabrication drawings as claimed in claim 17, wherein the step of generating further includes the steps of:

scaling PWB elements; and placing the scaled PWB elements into a plot file.

19. A method for producing PWB fabrication drawings as claimed in claim 18, wherein the step of placing PWB elements includes the steps of:

highlighting by a user a PWB element to be moved;

updating a pixel structure of the highlighted PWB element; and redraw the PWB fabrication drawing with the highlighted PWB element.

20. A method for producing PWB fabrication drawings as claimed in claim 19, wherein the step of placing the scaled PWB elements includes the step of waiting until a placement location is selected by the user.

21. A method for producing PWB fabrication drawings as claimed in claim 20, wherein the step of placing the scaled PWB elements includes the steps of:

moving the highlighted PWB element to a new location on the PWB fabrication drawing;

updating a pixel structure of the new location of the highlighted PWB element on the PWB fabrication drawing; and redrawing the PWB fabrication drawing with the highlighted PWB element at the new location.

22. A method for producing PWB fabrication drawings as claimed in claim 21, wherein the step of scaling the PWB elements includes the steps of:

obtaining a scale value from the user;

verifying an accuracy of the scale value;

obtaining coordinates of the PWB element;

multiplying the coordinates of the PWB element by the scale value to produce new coordinates; and updating the coordinates of the PWB element to be the new coordinates.

23. A method for producing PWB fabrication drawings as claimed in claim 22, wherein the step of scaling the PWB element includes the steps of:

moving the updated coordinates of the PWB element to a new location on the PWB fabrication drawing;

updating a pixel structure of the updated coordinates of the new location on the PWB fabrication drawing; and redrawing the PWB fabrication drawing with the updated coordinates of the PWB element at the new location.

24. A method for producing PWB fabrication drawings as claimed in claim 23, wherein the step of transferring includes the steps of:

merging the updated drill hole table, the custom note table and the plot file to form an output plot file; and transferring the output plot file to an Allegro program for production of the PWB fabrication drawings.

25. A method for producing PWB fabrication drawings as claimed in claim 24, wherein the step of merging includes the steps of:

computing an origin of the output plot file;

determining a plot file type for a symbol of the PWB fabrication drawing;

substituting updated text into the output plot file, if the plot file type is text;

providing a location based on the origin for a graphic element, if the plot file type is the graphic element; and iterating the steps of: determining, substituting and providing for each of a plulality of plot file types.

26. A method for producing PWB fabrication drawings as claimed in claim 25, wherein the step of merging further includes the step of iterating the steps of: computing, determining, substituting, providing and iteration for a plurality of PWB fabrication drawings.

27. A method for producing PWB fabrication drawings as claimed in claim 1, wherein there is further included the steps of:

creating PWB layer data for a PWB;

decoding custom note strings for the PWB;

finding drill hole data for the PWB; and checking the drill hole data with the PWB layer data for the PWB.

28. A method for producing PWB fabrication drawings as claimed in claim 27, wherein there is further included the step of iterating the steps of: creating, decoding, finding and checking for each of a plurality of PWBs.

* * * * *